United States Patent [19]

Richards

[11] Patent Number: 4,897,727
[45] Date of Patent: Jan. 30, 1990

[54] TELEVISION TUNING SYSTEM ALLOWING RAPID RESPONSE TO USER INITIATED COMMANDS

[75] Inventor: Roger L. Richards, Indianapolis, Ind.

[73] Assignee: Thomson Consumer Electronics, Inc., Indianapolis, Ind.

[21] Appl. No.: 191,645

[22] Filed: May 9, 1988

[51] Int. Cl.[4] .......................... H04N 5/50; H04N 5/44
[52] U.S. Cl. ................................ 358/194.1; 358/188; 358/191.1; 455/151; 455/352
[58] Field of Search ...................... 358/188, 190, 191.1, 358/194.1; 455/151, 186, 352, 353

[56] References Cited

U.S. PATENT DOCUMENTS

| | | | |
|---|---|---|---|
| 4,318,130 | 3/1982 | Heuer | 358/191.1 |
| 4,510,623 | 4/1985 | Bonneau et al. | 358/191.1 |
| 4,737,993 | 4/1988 | DeVilbiss | 358/191.1 |
| 4,763,195 | 8/1988 | Tults | 358/191.1 |

Primary Examiner—John K. Peng
Attorney, Agent, or Firm—Joseph S. Tripoli; Peter M. Emanuel

[57] ABSTRACT

The operation of a tuner of a television receiver for tuning nonstandard, as well as standard, frequency RF television signals, requiring a relatively long time for completion, is partitioned into a number of shorter duration sections or "slices" which are individually time-multiplexed with other control operations under the control of a microprocessor. This allows the microprocessor to more frequently respond to new user initiated commands than otherwise possible. An interrupt subroutine of the stored program under which the microprocessor operates establishes time delays, required for the tuning system to settle before new operations are performed, outside the main control loop including the user command processing and tuner control subroutines so as not to slow the response of the microprocessor to user commands.

7 Claims, 7 Drawing Sheets

TELEVISION TUNING SYSTEM ALLOWING RAPID RESPONSE TO USER INITIATED COMMANDS

The present invention concerns a tuning system, especially a tuning system for a television receiver.

Many tuning systems for television receivers are capable of automatically tuning RF television signals with standard frequencies, provided by a broadcast receiving antenna, and also RF television signals with nonstandard frequencies, such as may be provided by a cable distribution network. Such tuning systems tend to be complicated and operate according to a control algorithm requiring a significant amount of time, e.g., in the order of 0.5 seconds.

Typically, a microprocessor or microcomputer (the terms are considered to be interchangeable for the purposes of this application) controls the operation of the tuning system in accordance with a stored program of instructions. Often, the microprocessor also performs other control functions of the television receiver such as processing user initiated command signals received from a control panel or remote control system to generate control signals for various portions of the receiver. The microprocessor performs the various control functions sequentially and therefore cannot perform more than one function at a time. Accordingly, the microprocessor cannot process user initiated commands while it is controlling the tuning operation. The long time required to complete the tuning operation may cause the response to user initiated commands to appear sluggish, sometimes requiring a user to repeatedly operate controls before a desired action is taken.

In accordance with the principles of the present invention, the tuning control operation of a tuning system is partitioned into a plurality of shorter operations and these shorter operations are caused to be individually performed in time-multiplexed fashion with other control operations, e.g., such as for processing user initiated commands. As a result, the time required to respond to user initiated commands is significantly reduced.

The present invention will be described with reference to the accompanying Drawing in which:

FIG. 1a shows an AFT signal waveform useful in understanding an aspect of the tuning system of the television receiver shown in FIG. 1;

Figure 1:
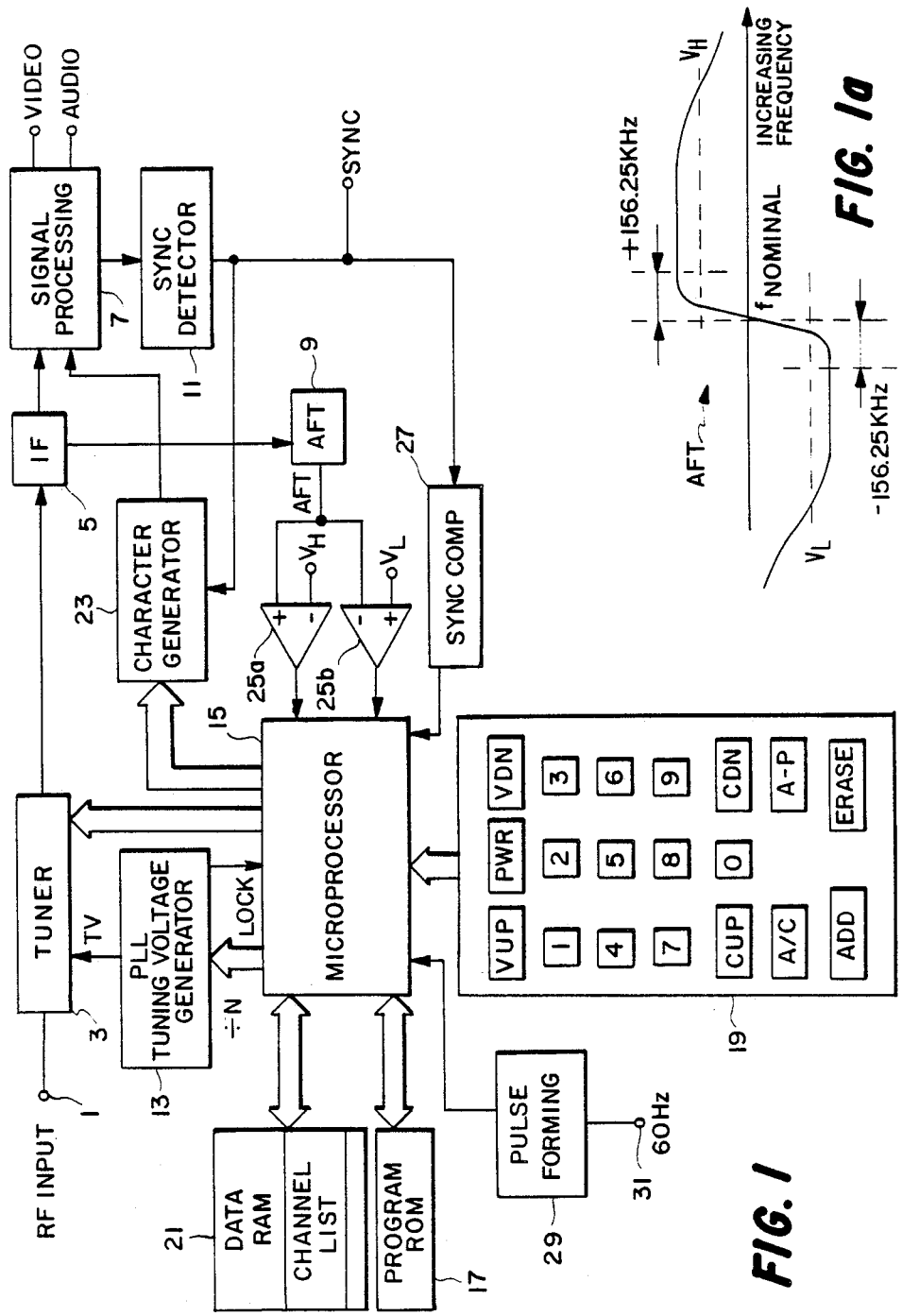
FIG. 1 shows a block diagram of a television receiver employing a preferred embodiment of the present invention.

The television receiver shown in FIG. 1 includes an RF input 1 which may be connected either to a broadcast receiving antenna for receiving "off-the-air" or broadcast RF signals associated with respective broadcast or "air" channels, to a cable distribution network for receiving RF signals associated with respective "cable" channels, or to a television accessory such as a video cassette recorder, video disc player, consumer video camera, home computer or video game. RF input 1 is connected to a tuner 3.

Tuner 3 is capable of tuning either air channels or cable channels. Such tuners are well known in the art and are sometimes referred to as being "cable-ready" or "cable-compatible". Although not shown, tuner 3 includes an RF stage and local oscillator responsive to band selection signals and to a tuning voltage (TV) for converting (heterodyning) the RF signal associated with a selected channel to a corresponding IF signal. The band selection signals determine the tuning configuration of the RF stage and the local oscillator according to the tuning band of the selected channel. The magnitude of the tuning voltage determines the RF signal selected by the RF stage and the frequency of the local oscillator.

The IF signal is processed in conventional fashion in an IF section 5 and coupled to a signal processing section 7. Signal processing section 7 demodulates the modulated picture and sound carriers of the IF signal and processes the resultant baseband video and audio signals in respective portions to produce video and audio output signals.

An automatic fine tuning (AFT) signal representing the deviation, if any, of the frequency of the picture carrier of the IF signal from a nominal frequency value, e.g., 45.75 MHz in the United States, is generated by an AFT detector 9. The typical S-shaped waveform of the AFT signal is shown in Figure 1a. The polarity of the AFT signal relative to a predetermined amplitude level corresponding to the nominal frequency represents the sense of the frequency deviation with respect to the nominal frequency and the amplitude of the AFT signal represents the magnitude of the frequency deviation. By way of example, in the present embodiment negative-going excursions below the amplitude level corresponding to the nominal frequency correspond to negative frequency deviations and positive-going excursions correspond to positive frequency deviations. The AFT signal is utilized in the tuning process as will be described below.

A composite synchronization ("sync") signal is derived from the video signal by a sync detector 11. In addition to its ordinary use for picture synchronization, the composite synchronization signal is also utilized in the tuning process as will also be explained below.

The tuning voltage for tuner 3 is generated by a tuning voltage generator 13 in response to a digital signal related to the selected channel. Tuning voltage generator 13 may be of the voltage synthesis type including a digital-to-analog converter or of the frequency synthesis type including a phase locked loop or a frequency locked loop. In the preferred embodiment, tuning voltage generator 13 is of the frequency synthesis type because of the inherent accuracy and stability of the type of system. A suitable frequency synthesis type of tuning voltage generator including a phase locked loop (PLL) is described in U.S. Pat. No. 4,405,947 issued in the name of J. Tults and M. P. French on Sept. 20, 1983. A suitable frequency synthesis type of tuning voltage generator including a frequency locked loop (FLL) is described in U.S. Pat. No. 4,485,404 issued in the name of J. Tults on Nov. 27, 1984. By way of example, a PLL tuning voltage generator is employed in the present embodiment.

Briefly, a PLL tuning voltage generator includes a fixed frequency divider (usually referred to as a "prescaler") for dividing the frequency of the local oscillator signal by a factor K and a programmable frequency divider for dividing the frequency of the output signal of the prescaler by a programmable factor N. A fixed frequency divider divides the frequency ($f_{XTAL}$) of the output signal of a crystal oscillator by a factor R to derive a reference frequency signal. A phase comparator compares the output signal of the programmable divider to the reference frequency signal to generate an "error" signal representing the phase and frequency deviations between the output signal of the programmable divider and the reference frequency signal. The error signal is filtered to produce the tuning voltage. The tuning voltage controls the frequency ($f_{LO}$) of the local oscillator so that:

$$f_{LO} = \frac{NK}{R} f_{XTAL}$$

Thus, the frequency of the local oscillator signal can be controlled by controlling programmable factor N. If K, R and $f_{XTAL}$ are selected so that K/R $f_{XTAL}$ equals 1 MHz, N is equal, in MHz, to the frequency of the local oscillator signal. Division factor N is controlled to locate and tune the RF signal corresponding to the selected channel as will be explained below. The tuning voltage generated by PLL tuning voltage generator for the local oscillator of tuner 3 is also coupled to the RF stage.

A microprocessor 15 controls the operation of the tuning system to tune a selected channel by generating a digital signal representing programmable factor N for PLL tuning voltage generator 13 and the appropriate band selection signals for tuner 3. Microprocessor 15 also controls the operation of other portions of the television receiver such as signal processing unit 7. Microprocessor 15 operates under the control of a computer program stored in a read-only-memory (ROM) 17. The portion of the program germane to the present invention is shown in flow chart form in FIGS. 2 and 2a–2d.

Microprocessor 15 responds to user command signals generated by a user control keyboard 19 to generate control signals for various portions of the receiver. Although keyboard 19 is shown directly connected to microprocessor 15 for simplicity, it may comprise the keyboard of a remote control unit.

Keyboard 19 includes keys for controlling various functions of the television receiver. By way of example, some of the keys are described below.

A "power key" (PWR) is provided for turning the receiver "on" and "off".

"Volume up" (VUP) and "volume down" (VDN) are provided for controlling the volume level.

Digit keys (0–9) are provided for directly selecting a channel by entering the tens and units digits of the respective two digit channel number.

"Channel up" (CUP) and "channel down" (CDN) keys are provided for initiating a "channel scanning" mode of channel selection in which channels are successively tuned in increasing or decreasing frequency order until a channel in a list of active channels is located. Those channels not in the list will be automatically skipped over during the channel scanning mode. The list of active channels is stored in a non-volatile random access memory (RAM) 21 associated with microprocessor 15. RAM 21 includes a plurality of one-bit memory locations for respective channels. A logic "1" is stored in the memory locations for each active channel and a logic "0" is stored in the memory locations for each inactive channel. The memory locations are addressed in accordance with the channel number of the selected channel.

Keyboard 19 also includes an "air/cable" (A/C) key for selecting either air or cable channels for tuning. A single-bit indication of the selected tuning mode (e.g., a logic "1" for air channels and a logic "0" for cable channels) is stored in RAM 21.

Keyboard 19 additionally includes an "auto-program" (A-P) key for initiating an "auto-programming" mode for automatically "programming" the active channel list of RAM 21. During the auto-programming mode, all the channels are successively selected for tuning and at each channel it is determined, as described below, whether or not a valid RF television signal is present. A logic "1" is entered into the one-bit memory location of RAM 21 for the respective channel if a valid RF television signal is present and a logic "0" is entered if a valid RF television signal is not present.

The user may not want to receive all the active channels located during the auto-programming mode. On the other hand, the user may want tuning to stop at certain channels, such as channels used for a video cassette recorder, video game or home computer, which may not be continuously active or which may not be located for other reasons, as will be discussed below, during the auto-programming mode. For these reasons, keyboard 19 also includes "erase" and "add" keys for manually deleting and adding channels from the list stored in RAM 21. The digit keys may be used in conjunction with the "erase" and "add" keys to delete channels and to add channels to the list stored in RAM 21.

Microprocessor 15 also controls a character generator 23 to produce a character representative signal which is coupled to the video processing portion of signal processing unit 7 so as to produce alphanumeric messages on the screen of the picture tube (not shown). These messages include the channel number of the presently selected channel, the present time of day and may also include operating instructions and a "menu" of control choices.

The values of the division factor N for each of the air channels with standard frequency RF signals are known in advance for every receiving location. Therefore, in the "air" tuning mode, when a new channel is selected for tuning, the precise value of N for the selected channel can be calculated as part of the control program for microprocessor 15.

However, the values of division factor N for each of the cable channels with non-standard frequency RF signals which may be offset in frequency with respect to respective standard frequency RF signals are not known in advance for every receiving location. Therefore, in the "cable" tuning mode, when a new channel is selected for tuning, a search for the correct value of N for the selected channel is conducted. During this search, the value of N is changed in steps in a range around the value of N for a respective standard frequency and, at each value of N, it is determined whether or not a valid television RF signal is present. The presence of a valid RF television signal is determined by examining the conditions of the AFT and/or the composite sync signal. AFT comparators 25a and 25b and a sync comparator 27 coupled to microprocessor 15 are provided for this purpose. A suitable sync comparator is disclosed in the Tults and French patent referred to above.

The search is partitioned into three different search operations: (1) a search using "predictable" (i.e., the most likely) cable frequencies; (2) a more comprehensive multi-frequency search if a valid RF television signal is not located during the predictable frequency search; and (3) a "fine tuning" search to more precisely tune an RF signal located during the step search. These three search operations will be described in detail below.

As might be expected, because of the need to tune nonstandard frequency RF signals (involving the three searches referred to above), as well as standard frequency RF signals, the tuning operation controlled by microprocessor 15 is complicated, including a number of different portions which have to be performed in sequence. Thus, the tuning operation may require a long time to complete, e.g., in the order of 0.5 seconds, depending on the particular characteristics of the RF signal of the channel selected for tuning. In prior systems having similarly complicated tuning operations, the response to newly entered user initiated commands was slow since the microprocessor could not respond until the entire tuning operation was complete.

Figure 2:
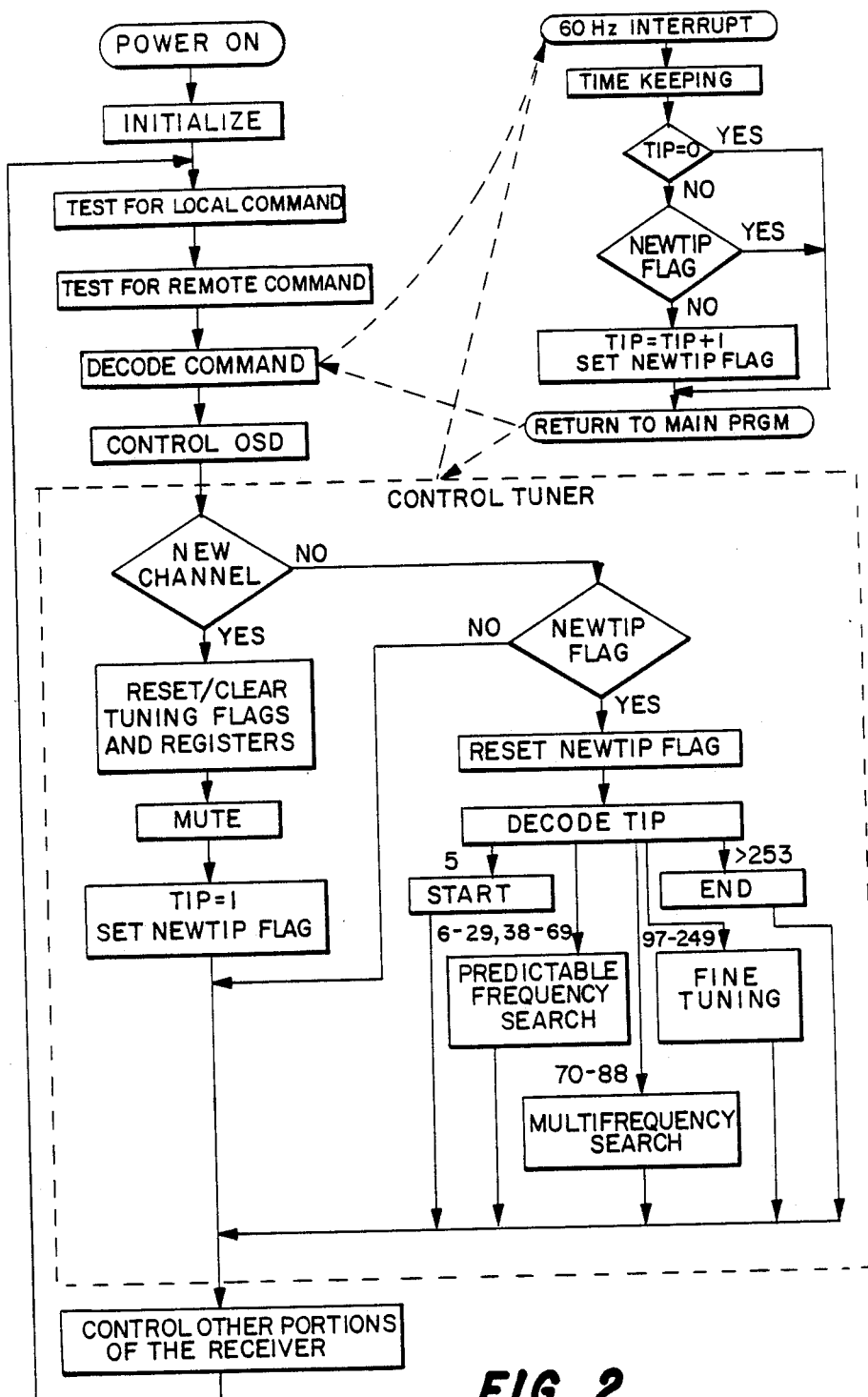
FIGS. 2 and 2a–2d show flow charts of a portion of the program of a microprocessor controller employed in the television shown in FIG. 1 for controlling the operation of the receiver in accordance with the principles of the present invention.

In accordance with an aspect of the present invention, the tuning operation is partitioned into smaller portions which are individually multiplexed in time with other operations, such as processing user initiated commands. Accordingly, microprocessor 15 can more quickly respond to newly entered user initiated commands and does not have to wait until the entire tuning operation has been completed. This results in a significant shortening of the time required to respond to user initiated commands. FIG. 2 shows a flow chart of the overall control program by which microprocessor 15 controls the operation of the television receiver shown in FIG. 1 and indicates how the latter is accomplished in accordance with the principles of the present invention.

The control program shown includes a main program and an "interrupt" subroutine. The main program includes a plurality of main subroutines which are executed in a repetitive sequence (or loop) after an initialization subroutine. The initialization subroutine is executed whenever operating power is initially applied to the receiver (i.e., when it is "plugged in") and causes certain initial operating conditions (e.g., preset volume, brightness, color and tint levels) to be established. The interrupt subroutine is executed once each cycle of an "interrupt" signal.

The main portion of the control program includes: a subroutine for determining if a user initiated command signal, generated when a user presses a key on a control panel mounted on the receiver itself or on a remote control transmitter, has been received; a subroutine for decoding the command; a subroutine for providing an appropriate on-the-screen display (OSD) message or instruction; a subroutine for controlling the tuning system; and one or more subroutines for controlling other portions of the receiver (e.g., turning the receiver "on" or "off", increasing or decreasing the volume level, etc.) in response to respective command signals. The tuning control subroutine is partitioned into sections, for controlling different tuning operations, and only one section or a portion of one of the sections is executed in each cycle of the main program. Thus, the execution of each section or portion of a section of the tuning control subroutine is individually time-multiplexed with the execution of the other subroutines. This means that only a relatively short time required to execute one section of the tuning control algorithm passes in each cycle of the main program before microprocessor 15 is again available to respond to user initiated commands and perform other functions.

Each section of the tuning control subroutine is identified by a number, referred to as a TIP (tuning in progress) number, or a group of TIP numbers. During the execution of the tuning control subroutine, the TIP number is decoded to determine which section of the tuning control subroutine should be executed next and therefore which tuning operation should be performed. After a section of the tuning control subroutine has been executed, the next subroutine of the main program (e.g., the subroutine for controlling other portions of the receiver in this embodiment) is executed. Therefore, the speed at which the control system can respond to user initiated commands is limited by the time required to execute one individual section of the tuning control subroutine and not the time required to complete the entire tuning control subroutine.

New TIP numbers are generated during the execution of the various sections of the tuning control subroutine or during the execution of the interrupt subroutine. Each time a new TIP number is generated a flag bit (called NEW TIP) of data RAM 21 is set. The interrupt subroutine will now be described.

As is known, an "interrupt" signal supplied to an "interrupt" input of a microprocessor causes the execution of a program to be halted temporarily while an "interrupt" subroutine is executed. When the interrupt subroutine has been completed, the execution of main program resumes from wherever it as halted. The interrupt operation of the present control program depicted in FIG. 2 is indicated by the pairs of dotted arrow lines, each pair including an arrow line from the main program to the interrupt subroutine and an arrow line from the interrupt subroutine to the main program.

In the present system, the interrupt subroutine is executed in response to a 60 Hz interrupt signal coupled to an interrupt input of microprocessor 15. Thus, the interrupt subroutine is executed every 16.67 milliseconds. The 60 Hz interrupt signal is derived by a pulse forming network 29 from a 60 Hz power line voltage available at a terminal 31.

As indicated in FIG. 2, the present interrupt subroutine has two primary purposes: (1) time keeping (e.g., for an on-the-screen display of the present time or for a timer function such as a "sleep" timer; and (2) to increase the TIP number by 1 if the NEW TIP flag has not been set during the execution of a section of the tuning control subroutine and if the execution of the entire tuning control subroutine has not been completed (as signified by TIP=0).

If a new TIP number does not correspond to any section, no tuning operation is performed until a TIP number corresponding to a section is generated. The latter condition corresponds to a time delay which is substantially equal to the number of TIP numbers which have not corresponded to a section of the tuning control subroutine multiplied by 16.67 milliseconds, i.e., the period of the interrupt signal. The delays allow tuner 3 and tuning voltage generator 13 to settle after the initiation of a new tuning operation. The use of the interrupt is advantageous in that time delays required to allow the tuner 3 and tuning voltage generator 13 to settle before new tuning operations are performed are provided outside of the main control program. Therefore the response to user initiated commands is not slowed by such time delays.

As earlier indicated, some tuning sections of the tuning control subroutine are identified by a group of TIP numbers. These sections correspond to the search operations referred to above in which frequency of the local oscillator signal is sequentially set to different values (by changing N) and at each frequency step one or both of the AFT signal or the sync signal is examined to determine whether or not a valid RF television signal has been found or properly tuned. These search operations tend to be lengthy and therefore may require several repetitions of the same section of the tuning control subroutine to complete. Providing a range of TIP numbers allows for the repetition of the respective section. It is noted however, that after each repetition, the next subroutine of the main program (e.g., the subroutine for controlling other portions of the receiver in this embodiment) is executed. Thus, the response to user initiated commands is not slowed by the repetitions necessary to complete a search operation. A repetition of a section of the tuning control subroutine may also be produced by resetting the TIP number to the first TIP number for that section.

Having now described an overview of the tuning operation, the tuning operation will now be described in detail with reference to the flow charts shown in FIGS. 2 and 2a–2d and the waveforms shown in FIGS. 3a and 3b.

As shown in FIG. 2, when it has been determined, during the tuning control subroutine, that a new channel has been selected, certain flag bits and registers used in the various sections of the tuning control subroutine to be described below are reset or cleared. Thereafter, a control signal is generated for causing the audio response to be muted so that no annoying noises can be produced while the tuning operation is in progress. Next, the TIP number is set to 1 and the NEW TIP FLAG is set. The tuning control subroutine is then exited.

During each of the next four executions of the interrupt subroutine after the TIP number is set to 1, the TIP number is increased by 1 (noting that the NEW TIP flag has been set) until the TIP number reaches 5. No tuning operations are allowed to occur until the TIP number reaches 5 in order to provide a sufficient time delay (e.g., 4×16.67 milliseconds) for the audio response to be fully muted.

Figure 2A:
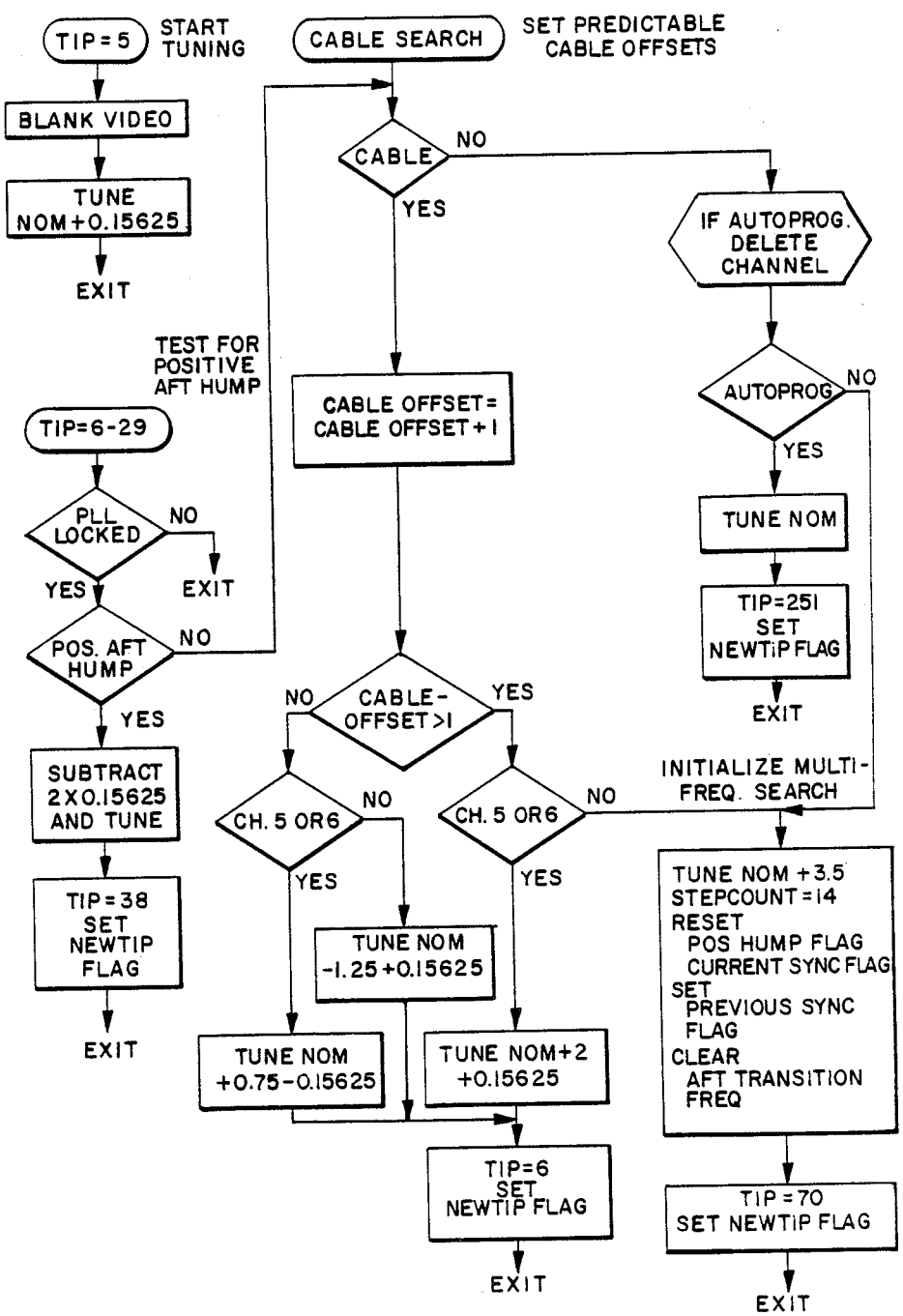

When the TIP number reaches 5, the tuning operation starts. At this point, as is shown in FIG. 2a, the video response is caused to be blanked (no time delay is provided for this operation since it happens very quickly compared to muting the audio response). Thereafter, the frequency of the local oscillator signal is set to the first frequency (corresponding to the nominal local oscillator frequency for tuning the standard frequency RF signal for the selected channel) of the predictable frequency search. The predictable frequency search starts at TIP number 6.

The predictable frequency search determines if a valid RF signal is present for any of the local oscillator frequencies corresponding to RF television signal frequencies most frequently employed in cable distribution networks. Searching the predictable frequencies at which valid RF television signals will most likely be found tends to shorten the time required for tuning a channel in the normal tuning mode and for locating an active channel in the auto-programming mode.

The major cable distribution networks employed in the United States utilize one of the following three frequency allocation systems:

1. Standard Cable System—The frequencies of the picture carriers for channels 2 to 6 and 7 to 13 are at the FCC assigned broadcast (standard) frequencies. Additional channels are provided with carriers at 6 MHz intervals between 91.25 MHz and 169.25 MHz and between 217.25 MHz and 643.25 MHz.

2. HRC (Harmonical Related Carriers) System—The frequencies of the picture carriers of all the channels, except channels 5 and 6, have frequency offsets of 1.25 MHz lower than respective frequencies of the Standard Cable System. The frequencies of the carriers for channels 5 and 6 are 0.75 MHz higher than respective frequencies of the Standard Cable System.

3. IRC (interval Related Carriers)—The frequencies of the carriers of all the channels, except channels 5 and 6, are not offset from respective frequencies of the Standard Cable System. The frequencies of the carriers for channels 5 and 6 are 2.0 MHz higher than respective frequencies of the Standard Cable System.

Accordingly, for use in the United States, for all channels selected for tuning, except channels 5 and 6, the predictable search frequencies correspond to:

The nominal (NOM) local oscillator frequency for the standard frequency RF picture carrier; and NOM−1.25 MHz For channels 5 and 6, the predictable search frequencies correspond to:

NOM;

NOM+0.75 MHz; and

NOM+2.0 MHz

Actually, pairs of search frequencies are used for each one of the predictable frequencies identified above. This is because the detection of both a positive AFT hump and a negative AFT hump indicates a presence of valid RF television signal during the predictable frequency search.

As shown in FIG. 1a, the AFT signal has a positive-going hump above a level $V_H$ and a negative-going hump below a level $V_L$. The detection of the positive and negative-going humps by AFT comparators 25a and 25b, respectively, indicates the presence of an RF carrier (either a picture carrier or a sound carrier) for a selected channel. The order in which the humps are detected relative to the direction of frequency change is important in properly identifying the presence of a picture carrier and therefore valid RF television signal. For the decreasing frequency direction of the local oscillator signal (and therefore of the IF signal) in the present embodiment, the positive-going hump (indicating a positive frequency deviation) is encountered before the negative-going hump (indicating a negative frequency deviation). The reverse is true for the increasing frequency direction. The $V_H$ and $V_L$ threshold voltages applied to comparators 25a and 25b correspond to the $V_H$ and $V_L$ levels of the AFT signal defining the positive and negative-going humps. Accordingly, during the predictable frequency search, the values of division factor N are set to produce pairs of frequencies for each of the five local oscillator search frequencies identified above to determine whether or not an RF carrier is present for a selected channel. A suitable choice for each of the frequency in the pairs is 156.25 KHz away from the respective predictable frequencies since 156.25 KHz is an integer multiple of the 31.25 KHz frequency step size utilized for fine tuning operation, as will be explained below.

Figure 3A:
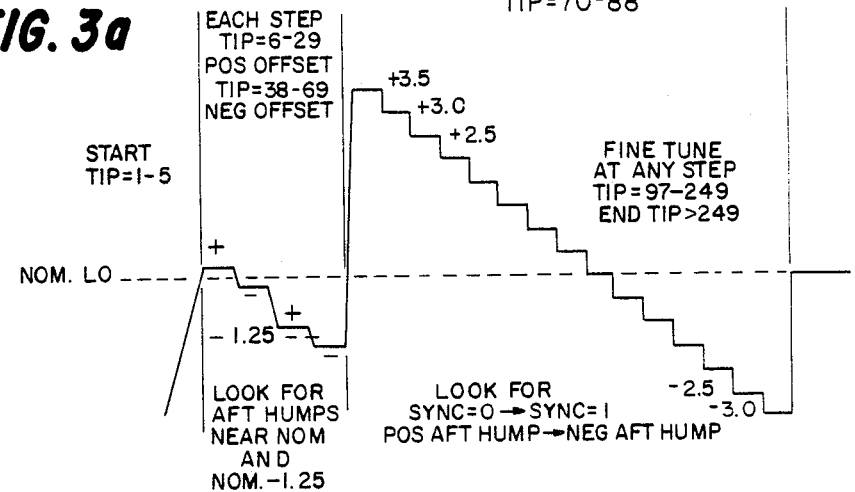
FIGS. 3a and 3b show waveforms indicating the tuning operation for the tuning system of the television receiver shown in FIG. 1.
Figure 3B:
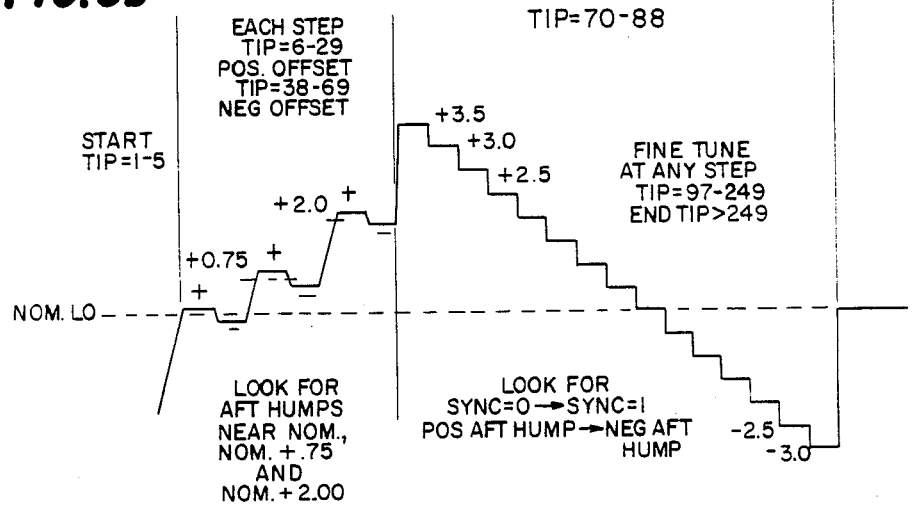

The waveforms for the predictable frequency search are shown in FIGS. 3a and 3b with reference to TIP numbers 6–29 and 38–69.

Figure 2B:
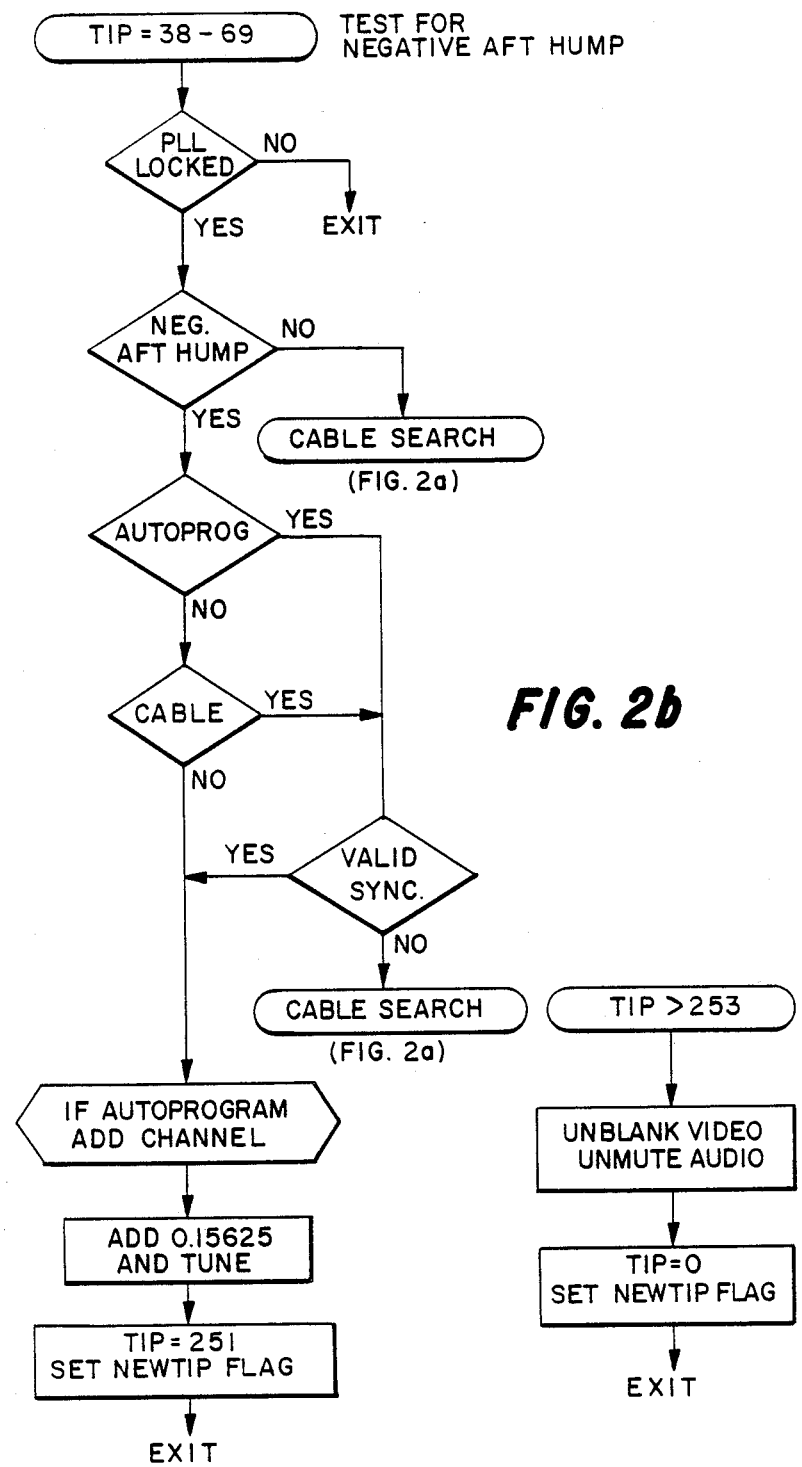

The flow charts for the predictable frequency search are shown in FIGS. 2a and 2b. As is indicated in FIG. 2a, TIP numbers 6–29 correspond to the test for a positive AFT hump (i.e., if the amplitude of the AFT is above threshold voltage $V_H$) for each of the predictable frequencies +156.25 KHz. All the frequencies are indicated in MHz in the flow charts. The "CABLE SEARCH" portion of the subroutine is responsible for setting each successive search frequency and utilizes a counter (called "CABLE OFFSET") for indicating what the next search step should be.

In the tuner control subroutine, whenever a new local oscillator frequency is established, the state of a "lock" signal generated by the phase locked loop, is examined to determine whether or not the loop has completed its operation (i.e., has "locked" the phase and frequency of the local oscillator signal to the reference frequency signal). If the PLL is not locked, the tuner control subroutine is exited to wait a predetermined time to allow the PLL to become locked. The required time is established utilizing the interrupt subroutine as explained above.

If a positive AFT hump has been detected, the TIP number is set to 38. As is indicated in FIG. 2b, TIP numbers 38–69 correspond to the test for a negative hump following the successful test for a positive hump.

As is indicated in FIG. 2a, if the "air" mode has been selected by a user, only the nominal (NOM) local oscillator frequency is tested.

If a positive AFT hump has not been detected or a negative AFT hump has not been detected following the detection of a positive AFT hump, in the normal tuning mode, the more comprehensive multi-frequency search is initiated by initializing certain registers and flags and setting the TIP number to 70. However, in the auto-programming mode, after deleting the channel from the channel list, the test is terminated by causing the nominal local oscillator frequency to be generated and by setting the TIP number to 251.

TIP number 251 corresponds to a section of the tuning subroutine for ending the tuning operation. When the TIP number reaches 253, the audio response is "unmuted" and the video response is "unblanked" and the TIP number is set to 0 to indicate the tuning operation has been completed.

As is shown in FIG. 2b, if both the AFT humps have been detected for a search frequency and the user has selected either the "auto-programming" mode or the "cable" mode, the predictable frequency search is terminated and the composite synchronization signal is examined. The composite sync signal is examined in these two modes for extra reliability since it is possible that the carrier detected by AFT comparators 23a and 23b may be a sound carrier rather than a picture carrier. If the composite sync signal is not valid, the multi-frequency search is initiated. If the composite sync signal is valid, the tuning operation is terminated and the channel is added to the channel list if the auto-programming mode was selected. If the "air" mode was selected (but not the auto-programming mode), the composite sync signal is not examined and a detection of both AFT humps results in the termination of the tuning operation and the addition of the channel to the channel list if the auto-programming mode was selected. An examination of the composite sync signal is not needed if the air mode is selected since it is very unlikely that the detected carrier is a sound carrier.

During the multi-frequency search, both the composite sync signal and the AFT signal are examined. As shown in FIGS. 3a and 3b with reference to TIP numbers 70–88, the multi-frequency search occurs at 0.5 MHz steps, starts at a local oscillator frequency 3.5 MHz higher than the nominal (NOM) frequency and ends at local oscillator frequency 3.0 MHz lower than the nominal frequency.

Unless the horizontal synchronization pulses of the video signal are suppressed, inverted or otherwise modified, such as when a scrambled "pay" channel is selected, the presence of a valid RF television signal is indicated when a valid composite sync signal is detected (e.g., a logic "1" is generated by composite sync comparator 27) for the current step but a valid composite sync signal was not detected (a logic "0" is generated) for the previous step. At that point, the local oscillator frequency corresponding to optimum tuning is no more than 0.5 MHz from the present step. If the direction of search were reversed, the test for the location of a picture carrier would be a transition from a valid composite sync condition to an invalid sync condition.

The "sync edge" search is utilized because it more precisely locates the picture carrier than by merely determining when the composite sync signal is valid. This is so because the sync signal is valid for very wide range (greater than 0.5 MHz) of local oscillator frequencies surrounding the local oscillator frequency corresponding to optimum tuning.

The presence of an RF signal when a scrambled "pay" channel is selected is indicated by the transition from a positive AFT hump to a negative AFT hump between steps of the multi-frequency search. If the direction of search were reversed, a transition from a negative AFT hump to a positive AFT hump would indicate the presence of an RF signal.

In the search, priority is given to the sync transition detection because the AFT transition can be produced by a sound carrier. The AFT transition frequency is used to tune the RF signal only if no sync transition has occurred during the entire search.

Figure 2C:
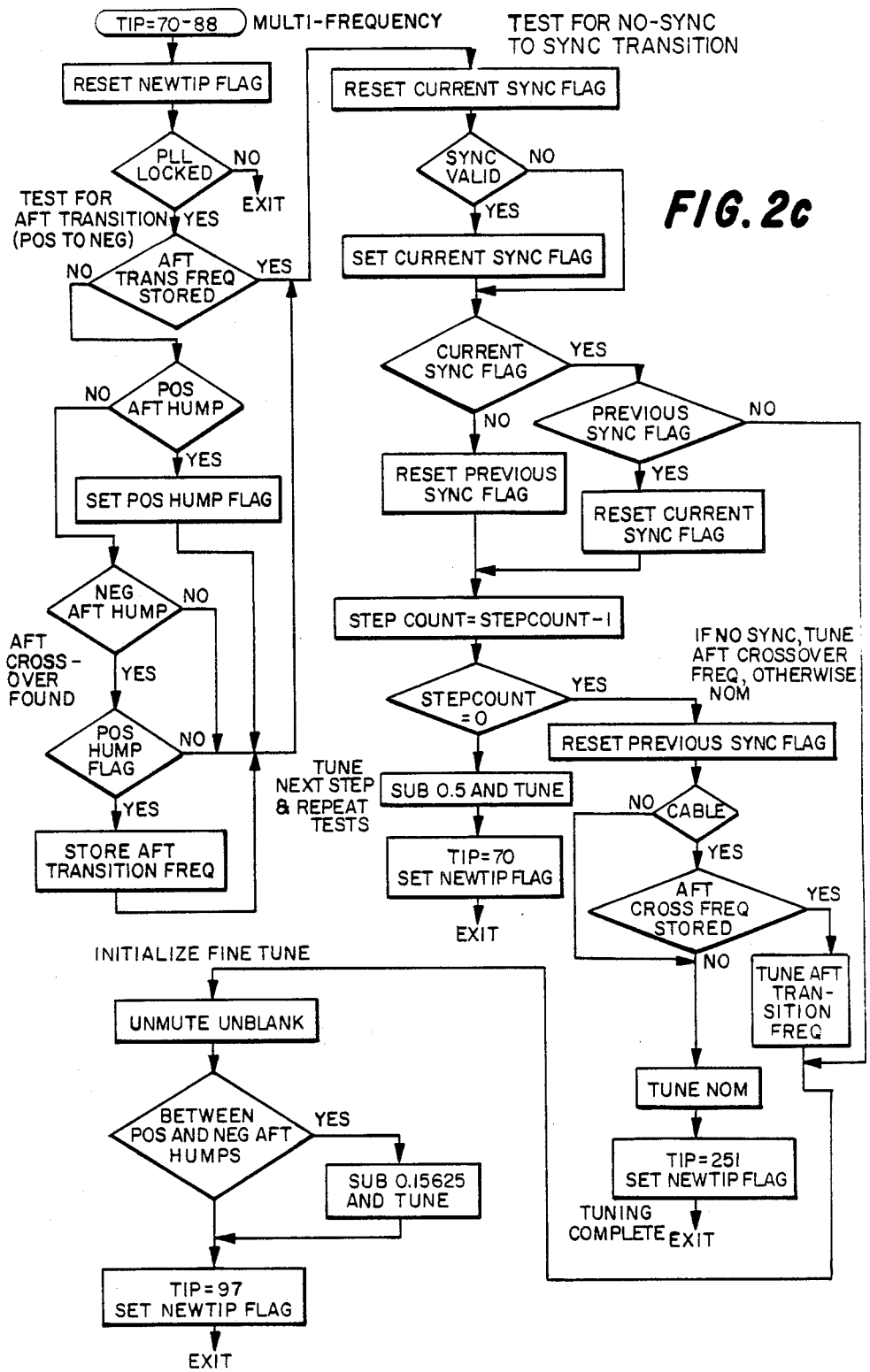

The flow chart for the multi-frequency search section of the tuning subroutine, corresponding to TIP numbers 70–88, is shown in FIG. 2c. Certain registers and flags are utilized as follows:

STEP COUNT—is used to keep track of the number of 0.5 MHz steps that have been taken and is initially set to 14 since there are 14 steps in a complete search;

CURRENT SYNC FLAG—is used to indicate that the composite sync signal is valid for a current step;

PREVIOUS SYNC FLAG—is used to indicate that the composite sync was valid for the previous step;

POS HUMP FLAG—is used to indicate that a positive AFT hump has been detected; and AFT TRANSITION—is used to indicate the frequency at which an AFT transition occurred.

At each step, if a sync transition is not detected, even if an AFT transition has been detected, the local oscillator frequency is lowered by a 0.5 MHz until all of the steps have been examined. If neither a sync transition or an AFT transition has been detected after all 14 steps have been examined, no RF signal is present for the selected channel and the local oscillator frequency is set to the nominal frequency for the selected channel. However, if a sync transition is located or if an AFT transition is located but not a sync transition, a fine tuning section of the tuning control program is initiated to optimize the tuning by setting the TIP number to 97 and establishing certain initial conditions for the fine tuning section. The initialization involves "unmuting" the audio response and "unblanking" the video response since the local oscillator frequency when a sync or AFT transition occurs is close to the optimum local oscillator frequency. It also involves lowering the local oscillator frequency by 156.25 KHz so that the IF picture carrier frequency is not between the two AFT humps.

Figure 2D:
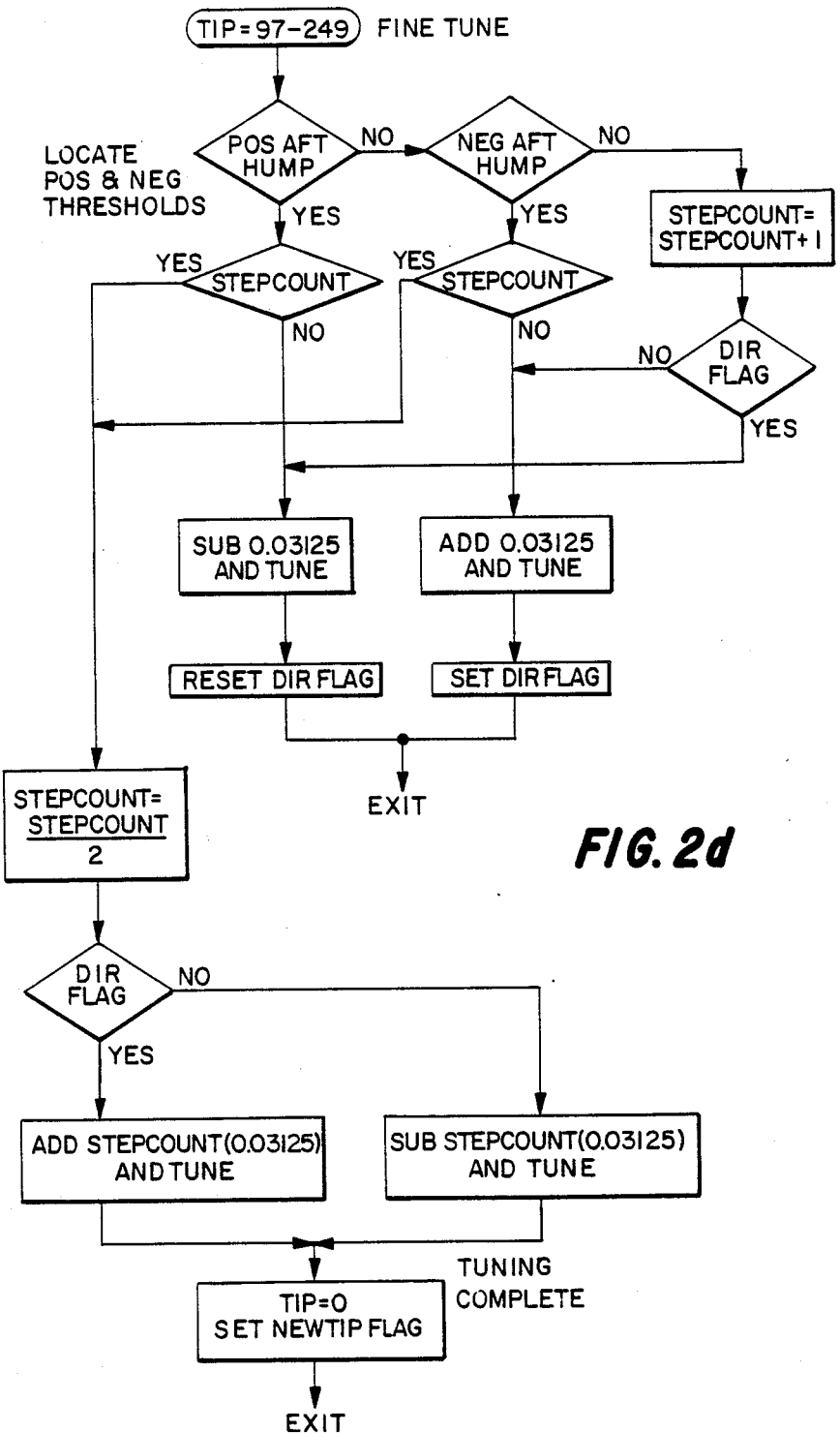

The flow chart for the fine tuning section, corresponding to TIP numbers 97–249, is shown in FIG. 2d. In this section, a search is made to locate the frequency locations of upper voltage level $V_H$ of the AFT signal corresponding to the positive AFT hump and lower voltage level $V_L$ corresponding to the negative AFT hump by taking small steps (e.g., 31.25 KHz) and determining when the respective levels are traversed (starting from a frequency not between the two humps). A flag (labelled DIR for direction) is utilized to indicate what the direction of frequency change should be. In this section, the STEP COUNT register is used to keep track of the number of steps taken between upper threshold level $V_H$ of the AFT signal corresponding to the positive AFT hump and the lower threshold level $V_L$ corresponding to the negative AFT hump.

At the end of the search, the contents of the STEP COUNT register (i.e., the number of steps between the levels associated with the two humps) is divided by 2 and multiplied by the step size (e.g., 31.25 KHz). The result is added or subtracted from the frequency determined during the multi-frequency search in accordance with the state of the DIR flag. At this point since the audio response has already been "unmuted" and the video response "unblanked", the tuning operation is complete and the TIP number is set to 0 to indicate this occurrence.

It will be understood that the tuning operation described above is exemplary and that modifications are possible. For example, some prescalers employed in PLL tuning systems may self-oscillate, causing the PLL to respond to the self-oscillation rather than to the local oscillator signal. Under such conditions the PLL will not complete its operation and will not "lock" (this is called a "hang-up"). It is known to examine the lock signal at the end of a predetermined time normally required for the PLL to lock and to cause the tuning voltage to change in the opposite sense (by controlling the phase detector) to correct the hang-up condition. Such a "hang-up" correction feature may be incorporated in the tuning control subroutine wherever the local oscillator frequency is changed. These and other modifications are intended to be within the scope of the invention defined by the following claims.

I claim:

1. In a receiver, apparatus comprising:
   an input for receiving a periodic interrupt signal;
   computer means operating in accordance with instructions of a stored program including a plurality of main subroutines, including a tuning control subroutine and a user command entry subroutine, executed in sequence in repetitive cycles of said program, and an interrupt subroutine executed in response to said interrupt signal, one of said main subroutines being interrupted when said interrupt subroutine is being executed and resuming when said interrupt subroutine is completed;
   user command entry means for generating command signals when activated by a user;
   said computer means being responsive to said command signals during the execution of said user command subroutine for generating control signals for respective portions of said receiver;
   an input for receiving a plurality of RF signals corresponding to respective channels; and
   tuner means operating in response to control signals generated by said computer means for tuning the one of said RF signals corresponding to a selected channel to produce an IF signal with a given characteristic;
   said tuner means operating in a progressive sequence in accordance with different sections of said tuning control subroutine occurring during successive executions of said tuning control subroutine within respective successive cycles of said program; the particular one of said sections occurring during the execution of said tuning control subroutine within a respective cycle of said program being determined by the operation undertaken by said tuner means in accordance with the one of said sections which has occurred during the execution of said tuning control subroutine within the previous cycle of said program.

2. The apparatus defined in claim 1, wherein:
   said interrupt subroutine includes a time-keeping subroutine for updating the present time of day during each execution of said interrupt subroutine.

3. The apparatus defined in claim 2, wherein:
   said interrupt signal is derived from an AC power line signal.

4. The apparatus defined in claim 1, wherein:
   said sections of said tuning control subroutine have respective identifying numbers;
   the identifying number for the next section to be executed is determined during the previous execution of a section and/or during the execution of said interrupt subroutine, the identifying number for the next section being determined during the execution of said interrupt subroutine by changing the identifying number by an increment; and
   the present identifying number is examined during said tuning subroutine to cause the corresponding operating mode to be initiated.

5. The apparatus defined in claim 4, wherein:
   at least one identifying number corresponds to a time delay for allowing said tuning means to settle.

6. The apparatus defined in claim 1, wherein:
   said RF signals include an information bearing carrier having either respective standard or nonstandard frequencies, said nonstandard frequencies being unpredictably near respective standard frequencies;
   said tuner means includes RF means for selecting the one of said RF signals corresponding to said selected channel under the control of said computer means; local oscillator means for generating a local oscillator signal having a frequency established in response to a control signal generated by said computer means; mixer means for combining said selected RF signal and said local oscillator signal to produce said IF signal; and detector means responsive to said IF signal for generating at least one tuning indicator signal indicating when said IF signal said given characteristic; and said tuner means operates in accordance with different ones of said sections of said tuning control subroutine to change the frequency of said local oscillator signal in increments in response to said tuning indicator signal.

7. The apparatus defined in claim 1, wherein:

a portion of said receiver produces an information response in response to said IF signal, said portion in response to a control signal generated by said computer means inhibiting said information response in accordance with one section of said tuning control subroutine and enabling said information response to be produced in accordance with another section of tuning control subroutine.

* * * * *